(12) United States Patent
Carlson et al.

(10) Patent No.: US 10,958,062 B2
(45) Date of Patent: Mar. 23, 2021

(54) SYSTEMS AND METHODS FOR DYNAMICALLY SWITCHING A LOAD OF A CURRENT TRANSFORMER CIRCUIT

(71) Applicant: ROCKWELL AUTOMATION TECHNOLOGIES, INC., Mayfield Heights, OH (US)

(72) Inventors: Andrew E Carlson, Oak Creek, WI (US); Daniel J Bolda, Menomonee Falls, WI (US); Joseph A Johnson, Hartford, WI (US); David M Messersmith, Kenosha, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 108 days.

(21) Appl. No.: 16/189,122

(22) Filed: Nov. 13, 2018

(65) Prior Publication Data
US 2020/0153227 A1    May 14, 2020

(51) Int. Cl.
*H02H 1/04*    (2006.01)
*G01R 19/00*    (2006.01)
(Continued)

(52) U.S. Cl.
CPC ......... *H02H 1/046* (2013.01); *G01R 19/0092* (2013.01); *G01R 31/62* (2020.01)

(58) Field of Classification Search
CPC ..... H02H 1/046; G01R 31/62; G01R 19/0092
See application file for complete search history.

(56) References Cited

U.S. PATENT DOCUMENTS

| 4,001,646 A | * | 1/1977 | Howell | ................. | H02H 3/331 361/45 |
| 4,027,203 A | | 5/1977 | Moran et al. | | |

(Continued)

FOREIGN PATENT DOCUMENTS

| DE | 1020100332238 A1 | 2/2012 |
| EP | 1113571 A2 | 7/2001 |
| WO | 2017001950 A1 | 1/2017 |

OTHER PUBLICATIONS

English Language Translation of German Patent No. DE1020100332238A1, dated Feb. 2, 2012, 10 pages.

(Continued)

*Primary Examiner* — Lee E Rodak
(74) *Attorney, Agent, or Firm* — Quarles & Brady LLP

(57) ABSTRACT

Current transformer circuit systems and methods dynamically switch a load. The current transformer circuit includes a current source circuit including at least one current transformer to produce a current output wave. A burden circuit includes at least one burden resistor and a voltage sensor, at least a portion of the current output wave to be passed through the burden resistor, and the voltage sensor to sense a voltage across the respective at least one burden resistor. A switch circuit includes at least one switch, the switch circuit coupled to the burden circuit. A microcontroller circuit includes a microcontroller, the microcontroller circuit coupled to a power circuit and the switch circuit, the microcontroller being configured to control the switch circuit to dynamically switch a secondary loading of the at least one current transformer between the burden resistor and a low resistance load.

19 Claims, 16 Drawing Sheets

(51) Int. Cl.
    *G01R 31/02*     (2006.01)
    *G01R 31/62*     (2020.01)

(56) References Cited

U.S. PATENT DOCUMENTS

| | | |
|---|---|---|
| 4,550,360 A | 10/1985 | Dougherty |
| 6,018,700 A | 1/2000 | Edel |
| 6,072,310 A | 6/2000 | Krebs et al. |
| 6,247,003 B1 | 6/2001 | Cummins et al. |
| 6,611,136 B2 | 8/2003 | Clausse et al. |
| 10,298,208 B1 * | 5/2019 | Venkatramani ......... H01F 27/28 |
| 2005/0140352 A1 | 6/2005 | Allain et al. |
| 2008/0012669 A1 | 1/2008 | Davison et al. |
| 2009/0115400 A1 | 5/2009 | Hunter |
| 2010/0169034 A1 | 7/2010 | Reid et al. |
| 2013/0328687 A1 * | 12/2013 | Nguyen ............... G01R 15/125 |
| | | 340/660 |
| 2016/0118785 A1 * | 4/2016 | Beck ...................... H01H 83/04 |
| | | 361/93.1 |
| 2017/0219639 A1 * | 8/2017 | Boudreau ............ G01R 22/066 |
| 2017/0336462 A1 * | 11/2017 | Kaufmann ................ H01H 9/54 |
| 2019/0162758 A1 * | 5/2019 | Hertz ................. G01R 19/0092 |
| 2020/0020480 A1 * | 1/2020 | Coquinco ............ G01R 15/183 |

OTHER PUBLICATIONS

European Patent Office, Extended European Search Report, Application No. 19208634.6, dated Apr. 7, 2020, 11 pages.

* cited by examiner

US 10,958,062 B2

SYSTEMS AND METHODS FOR DYNAMICALLY SWITCHING A LOAD OF A CURRENT TRANSFORMER CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND INFORMATION

The subject matter disclosed herein relates generally to current transformer circuits, and, more particularly, to systems and methods for dynamically switching the load of the current transformer circuit.

Currently, current transformers require a large size for accurate measurement. If a current transformer is too small, it may saturate during operation. Saturation causes inaccurate measurements of the current passing through a load of a current source. Unfortunately, larger current transformers cost significantly more than a smaller transformer, as well as take up more space.

Additionally, the current transformers may also be used to power the electrical device's circuitry, thereby replacing a traditional power supply to save both space and cost. This function requires the electrical device to switch between a measurement mode for measuring the current of the current source and a power supply mode to power the electrical device's circuitry.

There is a need, therefore, for improved electrical devices that utilize smaller current transformers, use the current transformers to power the circuitry of the electrical device, and provide measurement of the current of a current source while minimizing cost and size.

BRIEF DESCRIPTION

In some embodiments, a current transformer circuit to dynamically switch a load is described. The current transformer circuit comprises a current source circuit including at least one current transformer to produce a current output wave, a burden circuit including at least one burden resistor and a voltage sensor, at least a portion of the current output wave to be passed through the burden resistor, and the voltage sensor to sense a voltage across the respective at least one burden resistor. The current transformer circuit further comprises a switch circuit including at least one switch, the switch circuit coupled to the burden circuit. The current transformer circuit further comprises a microcontroller circuit including a microcontroller, the microcontroller circuit coupled to a power circuit and the switch circuit, the microcontroller being configured to control the switch circuit to dynamically switch a secondary loading of the at least one current transformer between the burden resistor and a low resistance load.

In some embodiments a current transformer circuit to dynamically switch a load is described. The current transformer circuit comprises a current source circuit including at least one current transformer to produce a current output wave. The current transformer circuit further comprises a burden circuit including at least one burden resistor and a voltage sensor, the voltage sensor to sense a voltage across the respective at least one burden resistor. The current transformer circuit further comprises a switch circuit including a burden switch and a CT short switch, the burden switch coupled to the burden circuit, and the CT short switch coupled to the at least one current transformer. The current transformer circuit further comprises a microcontroller circuit including a microcontroller, the microcontroller circuit coupled to a power circuit and the switch circuit, the microcontroller being configured to control the switch circuit to dynamically switch a secondary loading of the at least one current transformer between the burden resistor and a low resistance load, such that in a second CT shorting configuration, the CT short switch is closed and the burden switch is open, and in a second sampling configuration, the CT short switch is open, and the burden switch is closed.

In some embodiments, a method for dynamically switching a load of a current transformer circuit is described. The method comprises the steps of dynamically switching the load of the current transformer circuit between a burden resistor, a power circuit, and a low resistance load.

To the accomplishment of the foregoing and related ends, the embodiments, then, comprise the features hereinafter fully described. The following description and the annexed drawings set forth in detail certain illustrative aspects of the invention. However, these aspects are indicative of but a few of the various ways in which the principles of the invention can be employed. Other aspects, advantages and novel features of the invention will become apparent from the following detailed description of the invention when considered in conjunction with the drawings.

BRIEF DESCRIPTION OF THE DRAWINGS

The embodiments will hereafter be described with reference to the accompanying drawings, wherein like reference numerals denote like elements, and.

DETAILED DESCRIPTION

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures. The figures depict selected embodiments and are not intended to limit the scope of embodiments of the invention. Skilled artisans will recognize the examples provided herein have many useful alternatives and fall within the scope of embodiments of the invention.

The following description refers to elements or features being "connected" or "coupled" together. As used herein, unless expressly stated otherwise, "connected" means that one element/feature is directly or indirectly connected to another element/feature, and not necessarily electrically or mechanically. Likewise, unless expressly stated otherwise, "coupled" means that one element/feature is directly or indirectly coupled to another element/feature, and not necessarily electrically or mechanically. Thus, although schematics shown in the figures depict example arrangements of processing elements, additional intervening elements, devices, features, components, or code may be present in an actual embodiment.

Embodiments of the invention may be described herein in terms of functional and/or logical block components and various processing steps. It should be appreciated that such block components may be realized by any number of hardware, software, and/or firmware components configured to perform the specified functions. For example, an embodiment may employ various integrated circuit components, e.g., digital signal processing elements, logic elements, diodes, etc., which may carry out a variety of functions under the control of one or more microprocessors or other control devices. Other embodiments may employ program code, or code in combination with other circuit components.

Figure 1:
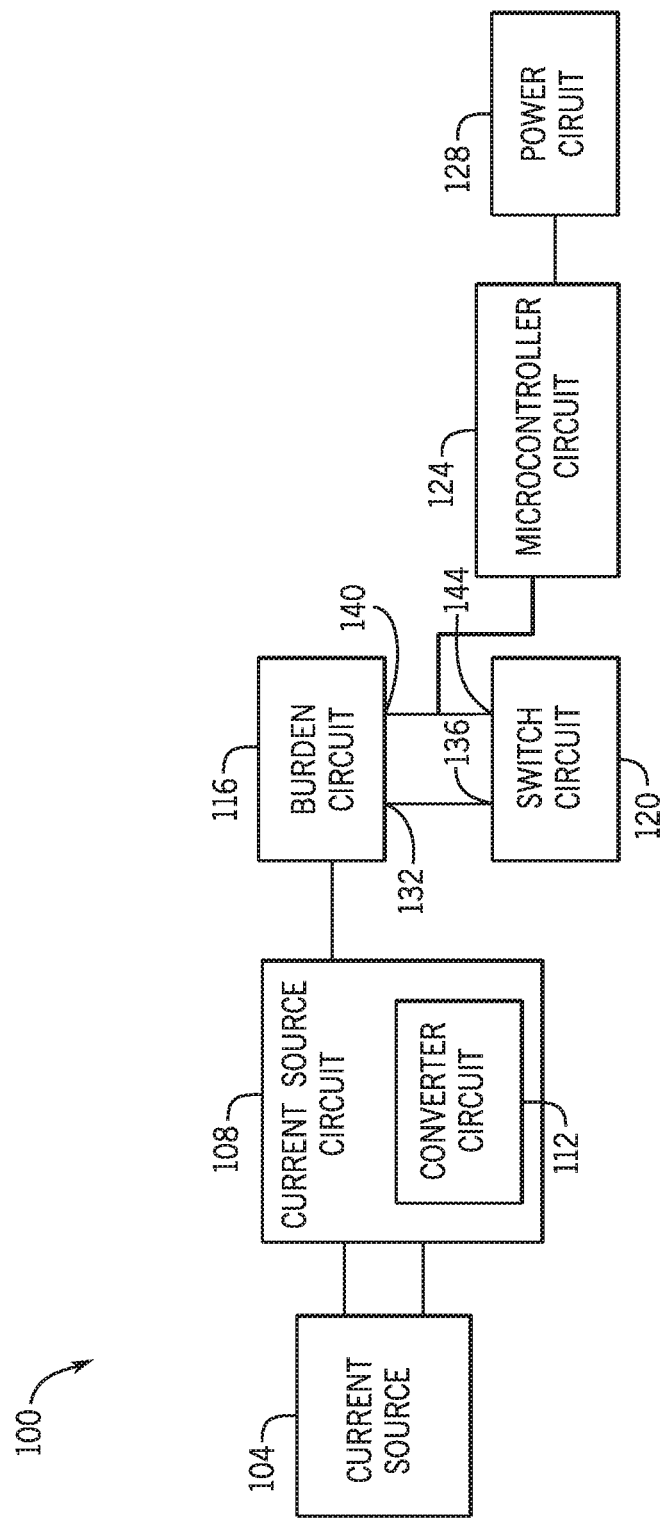
FIG. 1 is a block diagram of a current transformer circuit according to embodiments of the present invention.

Turning now to the drawings, an exemplary embodiment of a current transformer circuit 100 will now be described and is shown in the block diagram of FIG. 1. The current transformer circuit 100 can accurately sense the load of one or more current sources 104 with reduced current transformer size. The current transformer circuit 100 may include a variety of components including, but not limited to, a current source circuit 108, a burden circuit 116, a switch circuit 120, a microcontroller circuit 124, and a power circuit 128. Each will be discussed in greater detail below.

In use, the current source circuit 108 is coupled to a current source 104. The current source circuit 108 can take a current input from the current source 104 and can output an output signal, which may be a half cycle or full cycle output wave (not shown). The output signal can be unipolar, for example. A converter circuit 112 may be used to convert an AC input signal from the current source 104 to a unipolar current output signal. The converter circuit 112 may be a bridge rectifier or any other device to convert an AC input signal to a unipolar current output signal.

The current source circuit 108 output may be coupled to a burden circuit 116. The burden circuit 116 may be provided to allow a microcontroller, microprocessor, or any appropriate control system to measure the load of one or more current sources. The burden circuit 116 may have a first output 132 coupled to a first input 136 of a switch circuit 120. The burden circuit may have a second output 140 coupled to a second input 144 of the switch circuit 120. The second output 140 may also be coupled to an input of the microcontroller circuit 124.

The microcontroller circuit 124 may be used to regulate voltage to a microcontroller, microprocessor, or any appropriate control system of an electrical device. The microcontroller circuit 124 may be coupled to a power circuit 128.

The power circuit 128 can be used to provide power to an electrical device. The power circuit 128 can also be used to power the microcontroller circuit using one or more capacitors.

Figure 2:
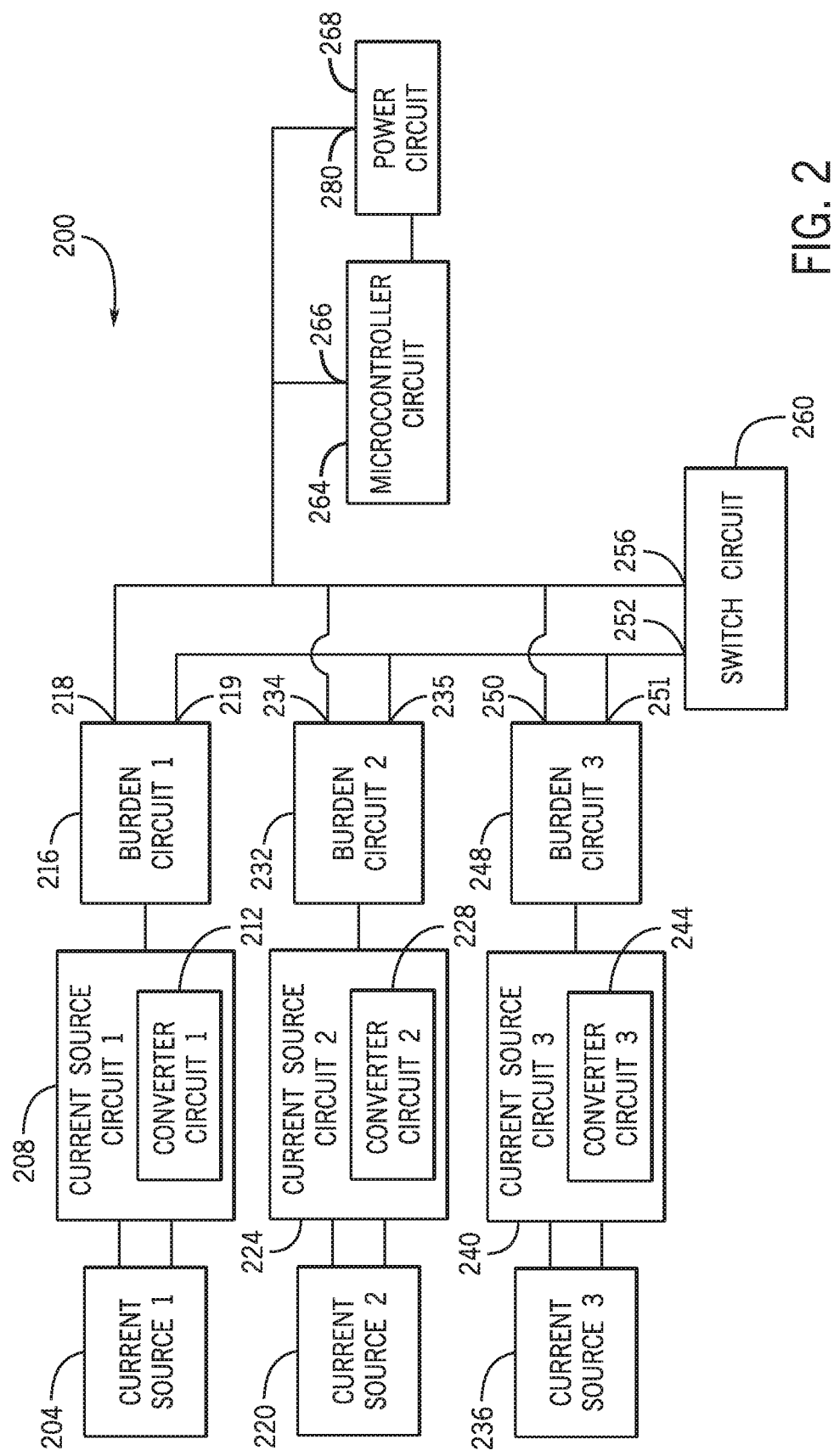
FIG. 2 is a block diagram of a three phase current transformer circuit according to embodiments of the present invention.

FIG. 2 illustrates an exemplary embodiment of a current transformer circuit 200 usable with a three phase electrical circuit. In this embodiment, there may be a plurality of current sources, current source circuits, and burden circuits. In the embodiment illustrated in FIG. 2, there may be a first current source 204, a second current source 220, and a third current source 236. The first current source 204 may be coupled to a first current source circuit 208. The second current source 220 may be coupled to a second current source circuit 224. The third current source 236 may be coupled to a third current source circuit 240. The first current source circuit 208 may be coupled to a first burden circuit 216. The second current source circuit 224 may be coupled to a second burden circuit 232. The third current source circuit 240 may be coupled to a third burden circuit 248. The first current source circuit 208 may have a first converter circuit 212. The second current source circuit 224 may have a second converter circuit 228. The third current source circuit 240 may have a third converter circuit 244. Each burden circuit 216, 232, 248 may have a first output 218, 234, 250 coupled to a first input 252 of a switch circuit 260. The first output 218, 234, 250 may also be coupled to an input 266 of a microcontroller circuit 264. Each burden circuit 216, 232, 248 may have a second output 219, 235, 251 coupled to a second input 256 of the switch circuit 260. The microcontroller circuit 264 may be used to regulate voltage to a microcontroller, microprocessor, or any appropriate control system. The microcontroller circuit 264 may be coupled to an input 280 of a power circuit 268.

Figure 3:
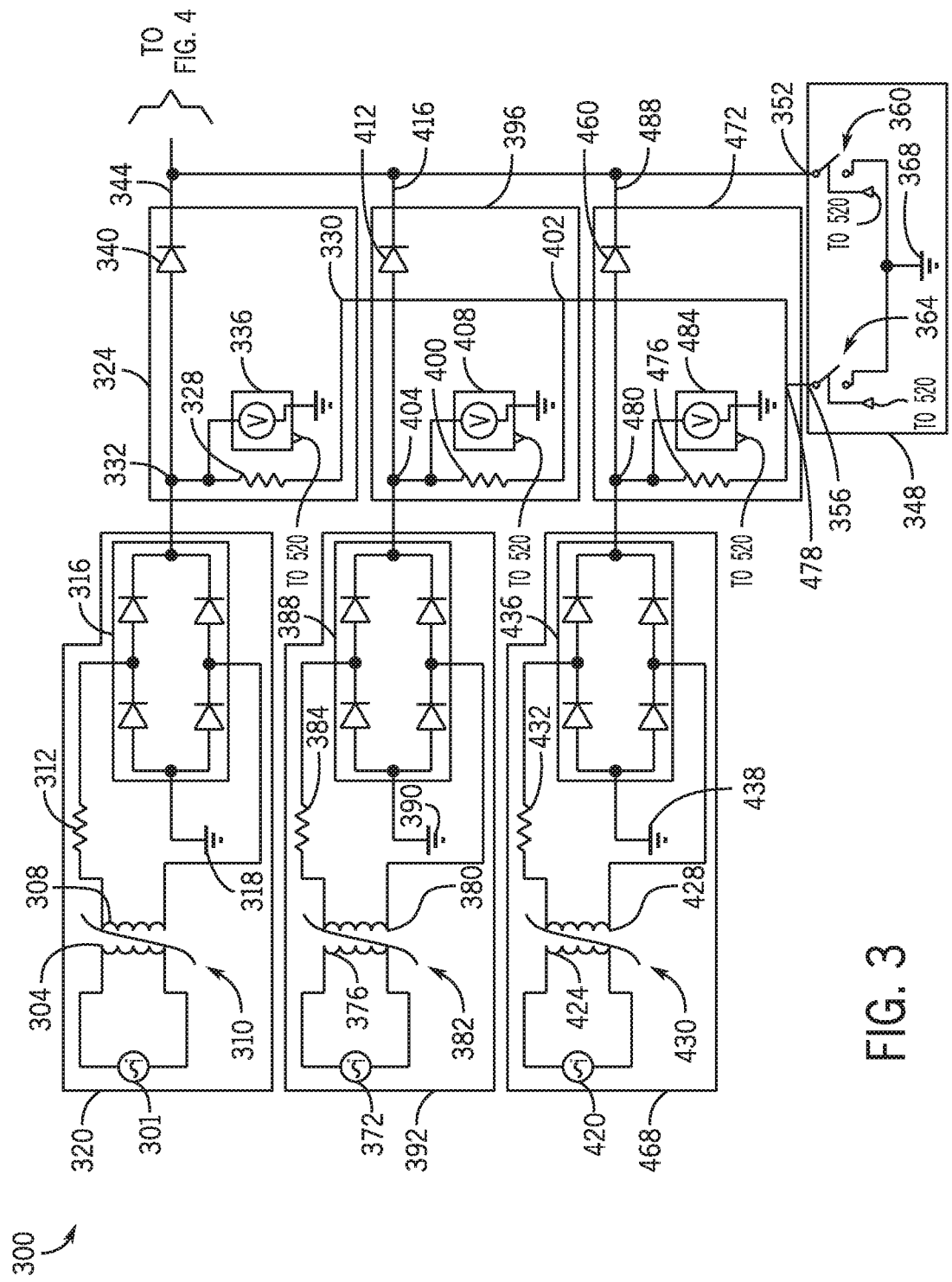
FIG. 3 is a circuit diagram of a portion of an exemplary current transformer circuit such as that illustrated in FIG. 2.

FIG. 3 illustrates an exemplary implementation of a current transformer circuit 300. A first current source 301 may be coupled in series with a primary winding 304 of a first current transformer 310 of a first current source circuit 320. A secondary winding 308 of the first current transformer 310 may be coupled to a first converter circuit 316. The first current transformer 310 may have an inherent winding resistance 312. The first converter circuit 316 may be a bridge rectifier or any other device to convert an AC input signal to a unipolar current output signal. The first converter circuit 316 may rectify an AC input signal to a full wave or half wave unipolar current output signal. The first converter circuit 316 may be coupled to a ground 318. The first converter circuit 316 may also be coupled to an input 332 of a first burden circuit 324.

The first burden circuit 324 may include a first burden resistor 328. The first burden resistor 328 may be coupled to the input 332 of the first burden circuit 324. The first burden circuit 324 may also include a first voltage sensor 336 configured to sense a voltage across the first burden resistor 328. The first burden resistor 328 may have a resistance in a range of 5-200 ohms, depending on the application, although both lower and higher resistance values are contemplated. A microcontroller 520 may be electrically coupled to the first voltage sensor 336. The first voltage sensor 336 may be an analog to digital converter. The first burden circuit 324 may include a diode 340. The diode 340 may be included to ensure current does not flow from a first output 344 of the first burden circuit 324 into the input 332 of the first burden circuit 324. The first burden circuit 324 may have the first output 344 coupled to a first input 352 of a switch circuit 348. The first output 344 may also be coupled to an input 500 of a microcontroller circuit 504. The first burden circuit 324 may have a second output 330 coupled to a second input 356 of the switch circuit 348.

A second current source 372 may be coupled in series with a primary winding 376 of a second current transformer 382 of a second current source circuit 392. A secondary winding 380 of the second current transformer 382 may be coupled to a second converter circuit 388. The second current transformer 382 may have an inherent winding resistance 384. The second converter circuit 388 may be a bridge rectifier or any other device to convert an AC input signal to a unipolar current output signal. The second converter circuit 388 may rectify an AC input signal to a full wave or half wave unipolar current output signal. The second converter circuit 388 may be coupled to a ground 390. The second converter circuit 388 may also be coupled to an input 404 of a second burden circuit 396.

The second burden circuit 396 may include a second burden resistor 400. The second burden resistor 400 may be coupled to the input 404 of the second burden circuit 396. The second burden circuit 396 may also include a second voltage sensor 408 configured to sense a voltage across the second burden resistor 400. The second burden resistor 400 may have a resistance in a range of 5-200 ohms, depending on the application, although both lower and higher resistance values are contemplated. The microcontroller 520 may be electrically coupled to the second voltage sensor 408. The second voltage sensor 408 may be an analog to digital converter. The second burden circuit 396 may include a diode 412. The diode 412 may be included to ensure current does not flow from a first output 416 of the second burden circuit 396 into the input 404 of the second burden circuit 396. The second burden circuit 396 may have the first output 416 coupled to the first input 352 of the switch circuit 348. The first output 416 may also be coupled to the input 500 of the microcontroller circuit 504. The second burden circuit 396 may have a second output 402 coupled to the second input 356 of the switch circuit 348.

A third current source 420 may be coupled in series with a primary winding 424 of a third current transformer 430 of a third current source circuit 468. A secondary winding 428 of the third current transformer 430 may be coupled to a third converter circuit 436. The third current transformer 430 may have an inherent winding resistance 432. The third converter circuit 436 may be a bridge rectifier or any other device to convert an AC input signal to a unipolar current output signal. The third converter circuit 436 may rectify an AC input signal to a full wave or half wave unipolar current output signal. The third converter circuit 436 may be coupled to a ground 438. The third converter circuit 436 may also be coupled to an input 480 of a third burden circuit 472.

The third burden circuit 472 may include a third burden resistor 476. The third burden resistor 476 may be coupled to the input 480 of the third burden circuit 472. The third burden circuit 472 may also include a third voltage sensor 484 configured to sense a voltage across the third burden resistor 476. The third burden resistor 476 may have a resistance in a range of 5-200 ohms, depending on the application, although both lower and higher resistance values are contemplated. The microcontroller 520 may be electrically coupled to the third voltage sensor 484. The third voltage sensor 484 may be an analog to digital converter. The third burden circuit 472 may include a diode 460. The diode 460 may be included to ensure current does not flow from a first output 488 of the third burden circuit 472 into the input 480 of the third burden circuit 472. The third burden circuit 472 may have the first output 488 coupled to the first input 352 of the switch circuit 348. The first output 488 may also be coupled to the input 500 of the microcontroller circuit 504. The third burden circuit 472 may have a second output 478, coupled to the second input 356 of the switch circuit 348.

The switch circuit 348 may include at least one switch. In some embodiments, the switch circuit 348 includes a current transformer (CT) short switch 360. The CT short switch 360 can be used to switch the secondary windings 308, 380, 428 of the first current transformer 310, second current transformer 382, or third current transformer 430 to a low resistance load 599, as discussed below. The low resistance load is ideally as close to 0 ohms as possible. The CT short switch 360 may be located in any part of the current transformer circuit 300 that can allow the secondary windings 308, 380, 428 to be switched to the low resistance load 599. In some embodiments, the CT short switch 360 can be coupled to the secondary windings 308, 380, 428. The CT short switch 360 may be coupled to the first input 352 of the switch circuit 348. The switch circuit 348 may include a burden switch 364. The burden switch 364 may be coupled to the second input 356 of the switch circuit 348. The CT short switch 360 or the burden switch 364 may be coupled to a ground 368.

Figure 4:
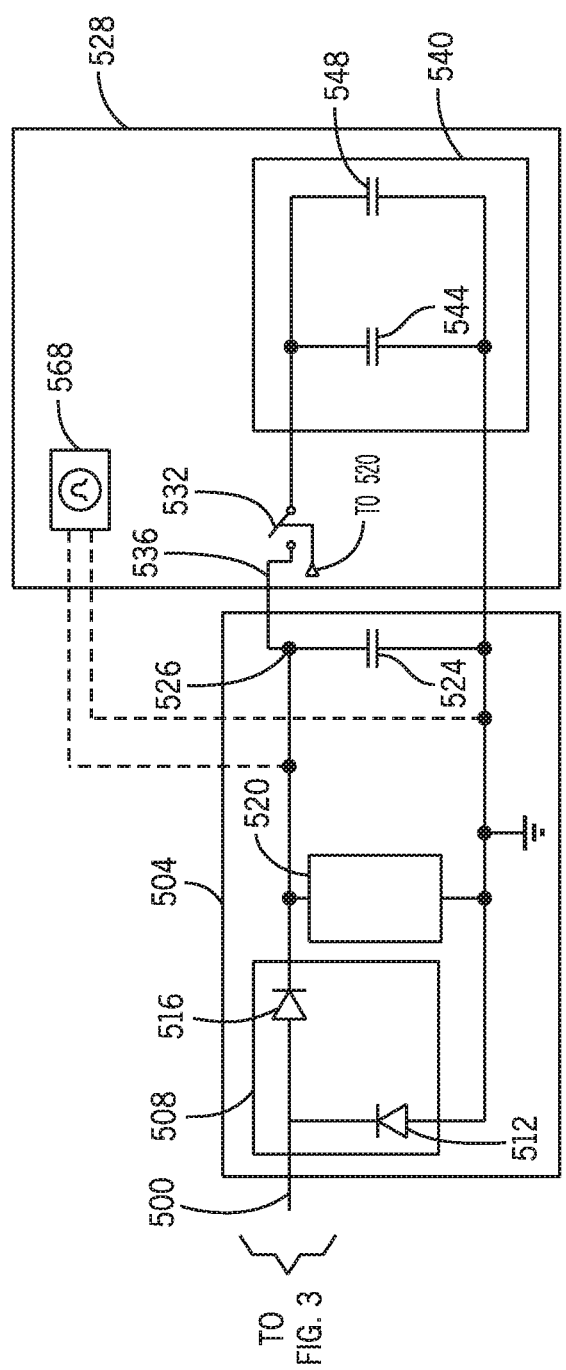
FIG. 4 is another circuit diagram of another portion of the exemplary current transformer circuit illustrated in FIG. 2.

Turning now to FIG. 3 as well as FIG. 4, the microcontroller circuit 504 may include a microcontroller 520. The microcontroller 520 may be electrically coupled to the burden switch 364 and the CT short switch 360. The microcontroller circuit 504 may include a holdup capacitor 524. The holdup capacitor 524 may provide power to the microcontroller 520 during certain operating modes as described below. The microcontroller circuit 504 may include a voltage regulation circuit 508. The voltage regulation circuit 508 can regulate the voltage level input to the microcontroller 520. The voltage regulation circuit 508 may include a first diode 512. The first diode 512 may be a Zener diode, for example. The first diode 512 can pull up the voltage incoming to the microcontroller circuit 504 to a value of about the operating voltage of the microcontroller 520. The microcontroller circuit 504 may include a second diode 516. The second diode 516 can prevent, during certain modes of operation, rapid depletion of the holdup capacitor 524 or any capacitors of the power circuit 528. The microcontroller circuit 504 may have a node 526. The node 526 may be coupled to a node 536 of a power circuit 528.

The power circuit 528 may include at least one capacitor 540. In some embodiments, there is a first capacitor 544 and a second capacitor 548. The first capacitor 544 may have more capacitance than the holdup capacitor 524. The second capacitor 548 may also have more capacitance than the holdup capacitor. 524. The capacitors 524, 544, 548 may have a capacitance in a range of 100-5000 µF, depending on the application, although both lower and higher capacitance values are contemplated. The power circuit 528 may include a relay capacitor switch 532. The microcontroller 520 may be electrically coupled to the relay capacitor switch 532. The relay capacitor switch 532 may be opened during an initial power up in order to charge the holdup capacitor 524 without charging the first capacitor 544 and the second capacitor 548. This can allow for faster initial start-up of the microcontroller 520. The relay capacitor switch 532 may also be opened to isolate the first capacitor 544 and the second capacitor 548 during activation of an electrical device such as an overload relay (not shown) or a circuit breaker (not shown). This can prevent the electrical device from dragging down the voltage of the holdup capacitor 524. The relay capacitor switch 532 may be closed in order to charge the first capacitor 544 and the second capacitor 548. The relay capacitor switch 532 may be closed in order for the power circuit 528 to provide power to the microcontroller 520. The power circuit 528 may also include an optional auxiliary power supply 568, with or without the use of the capacitors 524, 544, or 548. The auxiliary power supply 568 can be coupled to the microcontroller circuit 504 in order to provide a predetermined nominal power to the microcontroller 520, or when included, to charge the capacitors 524, 544, or 548. In some embodiments, the auxiliary power supply 568 can be coupled to the capacitors 544, 548 in order to provide power to the microcontroller 520 or charge the capacitors 524, 544, or 548.

In a first mode of operation 600, the microcontroller 520 may close the relay capacitor switch 532 if not already closed, may open the burden switch 364 if not already open, and may open the CT short switch 360 if not already open to create a first power supply configuration. The first power supply configuration provides power to the microcontroller circuit 504 or the power circuit 528.

For an initial power up, the microcontroller 520 may open the relay capacitor switch 532 if not already open, may open the burden switch 364 if not already open, and may open the CT short switch 360 if not already open to create a startup power supply configuration. The startup power supply configuration allows the holdup capacitor 524 to charge up quickly. The microcontroller 520 may instruct the current transformer circuit 300 to change from the startup power supply configuration to the first power supply configuration when the holdup capacitor 524 is charged. The microcontroller 520 may instruct the current transformer circuit 300 to change from the first power supply configuration to the startup power supply configuration when the holdup capacitor 524 is below a startup threshold voltage. The startup threshold voltage may be a minimum voltage required for operation of the microcontroller 520. In this embodiment, the startup threshold voltage can be about 5V. While in the first power supply configuration or the startup power supply configuration, the secondary windings 308, 380, 428 of the first current transformer 310, second current transformer 382, or third current transformer 430 are switched to a high voltage load. The high voltage load can include the microcontroller circuit 504 and/or the power circuit 528. The high voltage load requires a relatively higher voltage than the low resistance load 599, which will be discussed later, due to the operating voltage requirements of the microcontroller 520. Selected parameters of the first power supply configuration and the startup power supply configuration are summarized below in Table 1.

TABLE 1

| Parameter | First Power Supply Configuration | Startup Power Supply Configuration |
|---|---|---|
| Relay capacitor switch 532 | Closed | Open |
| CT short switch 360 | Open | Open |
| Burden switch 364 | Open | Open |
| Burden Resistor Sampling | No | No |
| Relative Voltage of Load | High | High |

In a second mode of operation 700, the microcontroller 520 may close the relay capacitor switch 532 if not already closed, may open the burden switch 364 if not already open, and may open the CT short switch 360 if not already open to create a second power supply configuration. The second power supply configuration provides power to the microcontroller circuit 504 or the power circuit 528. While in the second power supply configuration, the secondary windings 308, 380, 428 of the first current transformer 310, second current transformer 382, or third current transformer 430 are switched to the high voltage load. The microcontroller 520 may intermittently open the relay capacitor switch 532 and close the burden switch 364 to create a first sampling configuration. The first sampling configuration switches the load seen by the secondary windings 308, 380, 428 of the first current transformer 310, second current transformer 382, or third current transformer 430 to a burden resistor load. The burden resistor load may develop a voltage representative of a current of variable magnitude and shape at the secondary windings the first current transformer 310, second current transformer 382, or third current transformer 430. The burden resistor load can include one or more of the burden resistors 328, 400, or 476. The microcontroller can hold the first sampling configuration for approximately less than a half cycle of a current output wave 572. The current output wave 572 can be the current wave produced from any of the secondary windings 308, 380, 428 of the current transformers 310, 382, 430. The first sampling configuration allows the microcontroller to sample data related to the first current source 301, second current source 372, or third current source 420. The microcontroller then may close the relay capacitor switch and may open the burden switch 364 to change into second power supply configuration. The microcontroller 520 may instruct the current transformer circuit 300 to change between second power supply configuration and first sampling configuration freely as long as the microcontroller 520 stays in the second mode of operation 700. The ratio of time spent in the second power supply configuration and the first sampling configuration may vary by application. For example, the current transformer circuit 300 may spend about 90% of the time in the second power supply configuration and 10% of the time in the first sampling configuration. Selected parameters of the second power supply configuration and the second sampling configuration are summarized below in Table 2.

TABLE 2

| Parameter | Second Power Supply Configuration | Second Sampling Configuration |
|---|---|---|
| Relay capacitor switch 532 | Closed | Open |
| CT short switch 360 | Open | Open |
| Burden switch 364 | Open | Closed |
| Burden Resistor Sampling | No | Yes |
| Relative Voltage of Load | High | Variable |

In a third mode of operation 800, the microcontroller 520 may close the relay capacitor switch 532 if not already closed, may open the burden switch 364 if not already open, and may close the CT short switch 360 if not already open to create a first CT shorting configuration. The first CT shorting configuration may also open the relay capacitor switch 532 in order for the current transformer circuit 300 to activate an electrical device, for example an overload relay or a circuit breaker, without dragging down the voltage of the current transformer circuit 300. The microcontroller may stay in the CT shorting configuration for more than a half cycle of the current output wave 572 to allow magnetic flux to dissipate in the cores of the current transformers 310, 382, 430. This is due to the current sources 301, 372, 420 reversing direction in the core of the first transformer 310, second current transformer 382, or third current transformer 430 respectively. While in the first CT shorting configuration, the secondary windings 308, 380, 428 of the first current transformer 310, second current transformer 382, or third current transformer 430 are switched to the low resistance load 599. The low resistance load 599 may include the winding resistance 312 of the first current transformer 310, a winding resistance 384 of the second current transformer 382, a winding resistance 432 of the third current transformer 430, the diode 340 of the first burden circuit 324, the diode 412 of the second burden circuit 396, or the diode 460 of the third burden circuit 472. The voltage of the low resistance load 599 can be lower than the voltage of the high voltage load. For example, in this embodiment, the voltage of the low resistance load 599 can be about 0.6V. The first CT shorting configuration allows the first current transformer 310, second current transformer 382, or third current transformer 430 to operate more efficiently and avoid saturation. Selected parameters of the first CT shorting configuration are summarized below in Table 3.

TABLE 3

| Parameter | First CT shorting configuration |
|---|---|
| Relay capacitor switch 532 | Open/Closed |
| CT short switch 360 | Closed |
| Burden switch 364 | Open |
| Burden Resistor Sampling | No |
| Relative Voltage of Load | Low |

In a fourth mode of operation 900, the microcontroller 520 may close the relay capacitor switch 532 if not already closed, may open the burden switch 364 if not already open, and may close the CT short switch 360 if not already open to create a second CT shorting configuration. When the power circuit 528 includes the optional auxiliary power supply 568, the microcontroller 520 may operate only in the fourth mode of operation 900. Some embodiments of the second CT shorting configuration may have an open relay capacitor switch 532 in order for the current transformer circuit 300 to activate an electrical device such as an overload relay or a circuit breaker without dragging down the voltage of the current transformer circuit 300. The microcontroller may stay in the second CT shorting configuration for more than a half cycle of the current output wave 572 to allow magnetic flux to dissipate in the cores of the current transformers 310, 382, 430. This is due to the current sources 301, 372, 420 reversing direction in the core of the first current transformer 310, second current transformer 382, or third current transformer 430 respectively. While in the second CT shorting configuration, the secondary windings 308, 380, 428 of the first current transformer 310, second current transformer 382, or third current transformer 430 are switched to the low resistance load 599. The second CT shorting configuration allows the first current transformer 310, second current transformer 382, or third current transformer 430 to operate more efficiently and avoid saturation. The microcontroller 520 may intermittently close the burden switch 364 and open the CT short switch 360 to create a second sampling configuration. Some embodiments of the second sampling configuration may have an open relay capacitor switch 532 in order for the current transformer circuit 300 to activate an electrical device such as an overload relay or a circuit breaker without dragging down the voltage of the current transformer circuit 300. The microcontroller will hold the second sampling configuration for less than a half cycle of the current output wave 572. The second sampling configuration allows the microcontroller to sample data related to the current sources 301, 372, or 420. The second sampling configuration switches the load seen by the secondary windings 308, 380, 428 of the first current transformer 310, second current transformer 382, or third current transformer 430 to the burden resistor load. The microcontroller then may open the burden switch 364 and may close the CT short switch 360 to change into second CT shorting configuration. The microcontroller 520 may instruct the current transformer circuit 300 to change between second CT shorting configuration and second sampling configuration freely as long as the microcontroller 520 stays in the fourth mode of operation 900. The ratio of time spent in the second CT shorting configuration and the second sampling configuration may vary by application. Selected parameters of the second CT shorting configuration and the second sampling configuration are summarized below in Table 4.

TABLE 4

| Parameter | Second CT shorting configuration | Second Sampling Configuration |
|---|---|---|
| Relay capacitor switch 532 | Open/Closed | Open/Closed |
| CT short switch 360 | Closed | Open |
| Burden switch 364 | Open | Closed |
| Burden Resistor Sampling | No | Yes |
| Relative Voltage of Load | Low | Variable |

Figure 13:
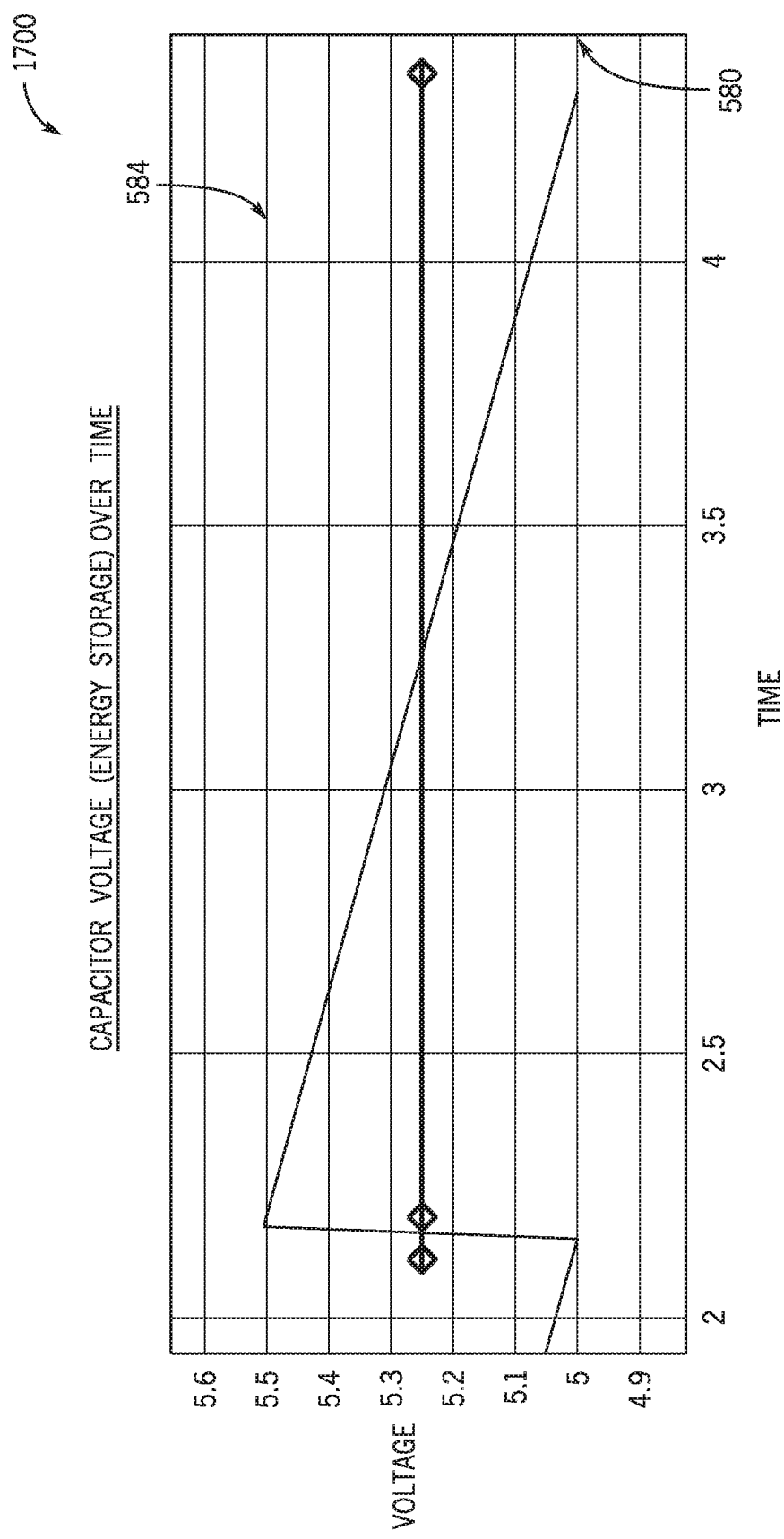
FIG. 13 is a graph of an exemplary voltage level of a capacitor over a period of time.

The microcontroller 520 may instruct the current transformer circuit 300 to change modes as dictated by the voltage levels of the microcontroller circuit 504 or the power circuit 528. If the voltage provided by the microcontroller circuit 504 or the power circuit 528 falls below a minimum threshold voltage 580, which is shown in FIG. 13, the microcontroller may switch from the current mode into the first mode of operation 600 or second mode of operation 700 in order to power the microcontroller circuit 504 or the power circuit 528. In this embodiment, the minimum threshold voltage 580 can be about 5V.

While in the first mode of operation 600 or the second mode of operation 700, the microcontroller 520 may switch into the third mode of operation 800 or fourth mode of operation 900 when a maximum threshold voltage 584, which is shown in FIG. 13, of the microcontroller circuit 504 or the power circuit 528 is obtained. In this embodiment, the maximum threshold voltage 584 can be about 5.5V.

The microcontroller 520 may also only use the third mode of operation 800 or the fourth mode of operation 900 or both if the power circuit 528 includes the power supply 568 that may supply power to the microcontroller circuit 504 or the power circuit 528.

While in the second mode of operation 700 or the fourth mode of operation 900, the microcontroller 520 may measure parameters related to harmonic current application For example, frequently sampling the voltage across the burden resistors can provide information about the waveform shape of a current wave of a current source, which can provide a more accurate RMS measurement in the presence of harmonics. These parameters may only be measured when there is little to no saturation in the first current transformer 310, second current transformer 382, or third current transformer 430.

Figure 5:
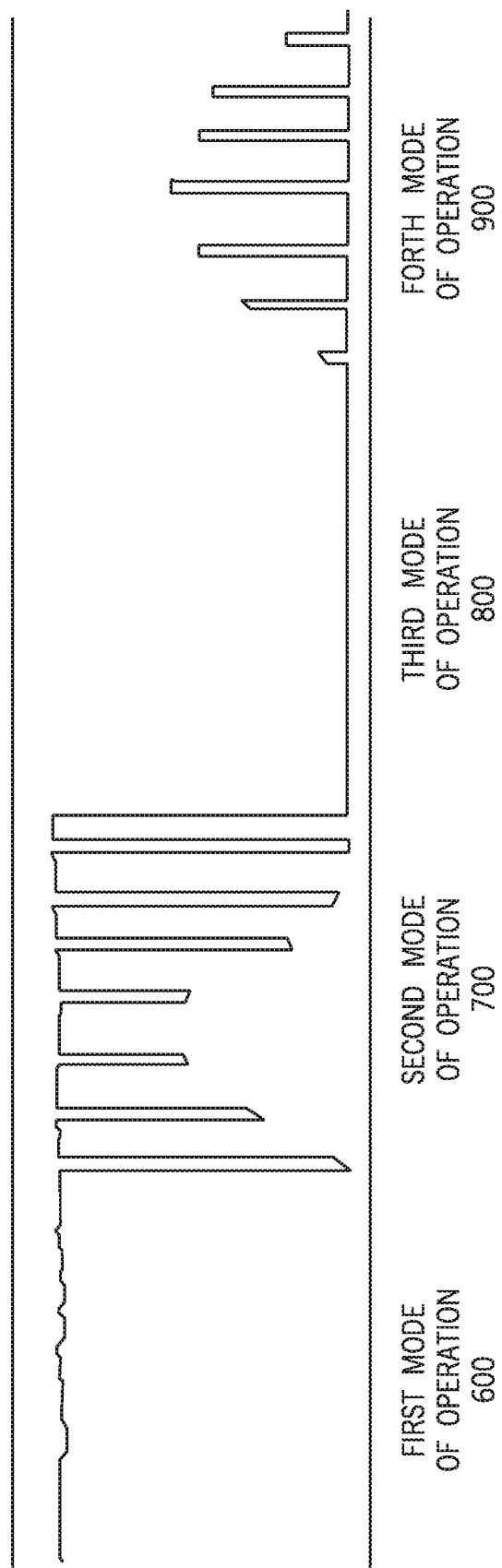
FIG. 5 is a voltage waveform representing an exemplary voltage at the secondary windings of the current transformer circuit during various modes of operation.

FIG. 5 shows the voltage at nodes 332, 404, or 480 in the various operation modes 600, 700, 800, or 900.

The average voltage over a given time period is much higher in the first mode of operation 600 or second mode of operation 700 compared to the average voltage over a given time period in the third mode of operation 800 or the fourth mode of operation 900. This leads to a higher likelihood of saturation in the first mode of operation 600 or second mode of operation 700 compared to the third mode of operation 800 or the fourth mode of operation 900. As saturation negatively affects measuring accuracy, measurements are preferably made in the fourth mode of operation 900.

While any of the modes of operation 600, 700, 800, 900 the microcontroller 520 can monitor an input voltage. If the microcontroller 520 senses the input voltage is below the minimum voltage threshold 580, the microcontroller 520 may switch from its current mode of operation into the first mode of operation 600 or second mode of operation 700. The first mode of operation 600 and the second mode of operation 700 may use the first power supply configuration or the second power supply configuration respectively in order to power the microcontroller 520, the holdup capacitor 524, and/or the power circuit 528.

While in any of the modes of operation 600, 700, 800, 900, if the microcontroller 520 senses the input voltage is above the maximum voltage threshold 584, the microcontroller 520 may switch from its current mode of operation into the third mode of operation 800 or fourth mode of operation 900. The third mode of operation 800 and fourth mode of operation 900 may use the first CT shorting configuration or the second CT shorting configuration respectively in order to utilize stored energy and operate in an energy efficient manner, as will be described later.

While in the second mode of operation 700 or the fourth mode of operation 900, the microcontroller 520 may instruct the current transformer circuit 300 to change from the current configuration into the first sampling configuration or the second sampling configuration respectively at a predetermined frequency and duration before switching back to the previous configuration. The frequency can range from 1-2 kHz, depending on the application. The duration can be about 60 microseconds, although both lower and higher duration values are contemplated.

If the power circuit 528 includes the power supply 568, the microcontroller 520 may only operate in the third mode of operation 800 and/or the fourth mode of operation 900 following a brief startup time period when the microcontroller 520 may operate in the first mode of operation 600. More specifically, the microcontroller 520 may only operate in the fourth mode of operation 900 following a brief startup time period when the microcontroller 520 may operate in the first mode of operation 600. If the power supply 568 can keep voltage incoming to the microcontroller 520 above the minimum threshold voltage 580, the microcontroller 520 may not need to instruct the current transformer circuit 300 to switch into the first power supply configuration and/or the second power supply configuration.

Figure 6:
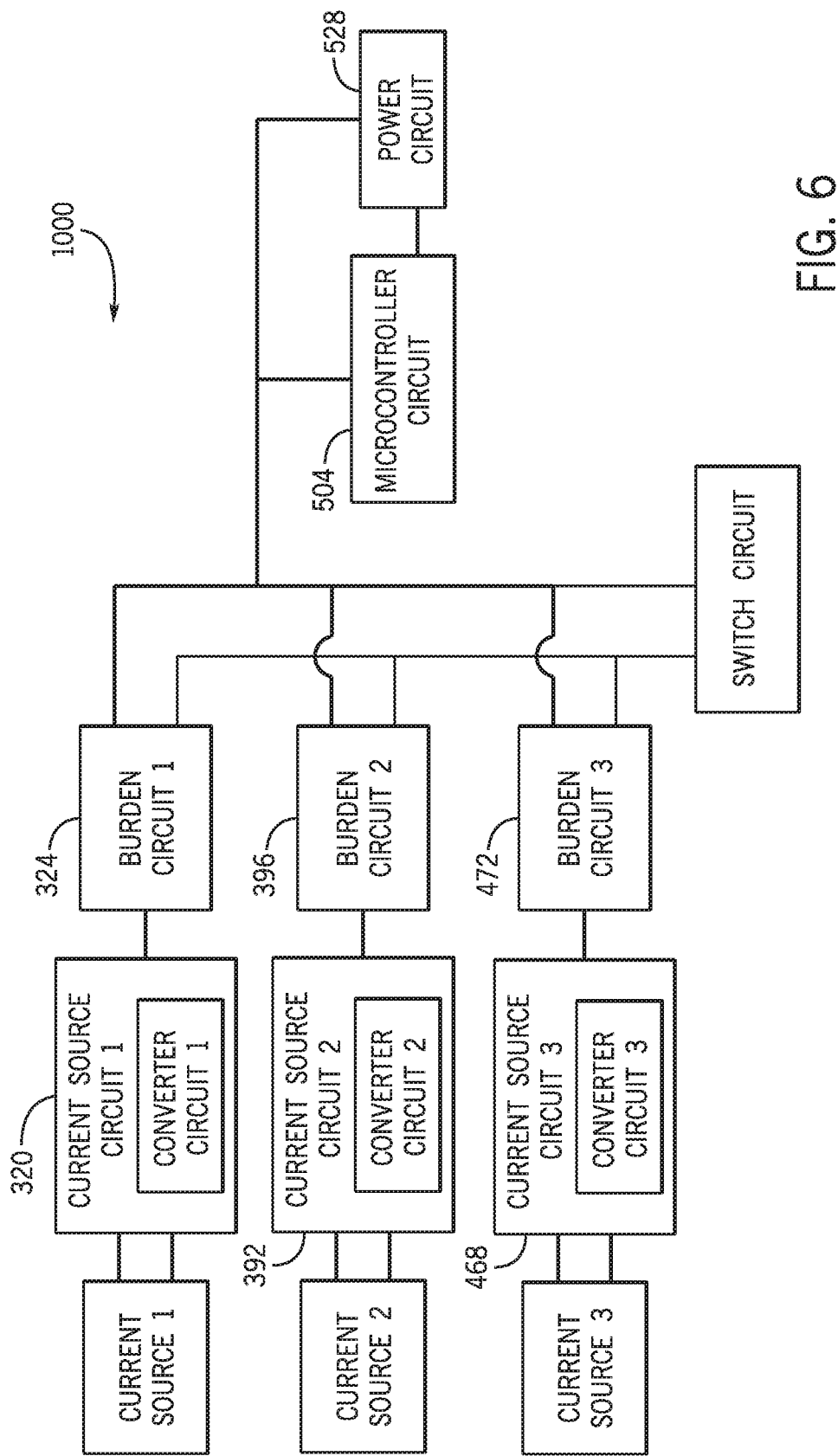
FIG. 6 is a circuit diagram showing current flow in a power supply configuration.

Referring now to FIG. 3 and to FIG. 6, a circuit diagram 1000 shows current flow in both the first power supply configuration and the second power supply configuration. Current may flow through the current source circuits 320, 392, or 468 into the burden circuits 324, 396, or 472. Current may flow through the inherent winding resistances 312, 384, or 432. Current may flow through the diodes 340, 412, or 460. Current may flow from the burden circuits 324, 396, or 472 into the microcontroller circuit 504. Current may flow from the microcontroller circuit 504 into the capacitor circuit 528. The current flowing from the current source circuits 320, 392, or 468 may have a voltage 1004 (shown in FIG. 14). Voltage 1004 can have a value equal to at least a sum of: a voltage drop of one of the inherent winding resistances 312, 384, or 432; a voltage drop of one of the diodes 340, 412, or 460; and the minimum threshold voltage 580. The minimum threshold voltage 580 may be higher than the sum of one of the voltage drops of one of the inherent winding resistances 312, 384, or 432 added to one of the voltage drops of one of the diodes 340, 412, or 460.

Figure 7:
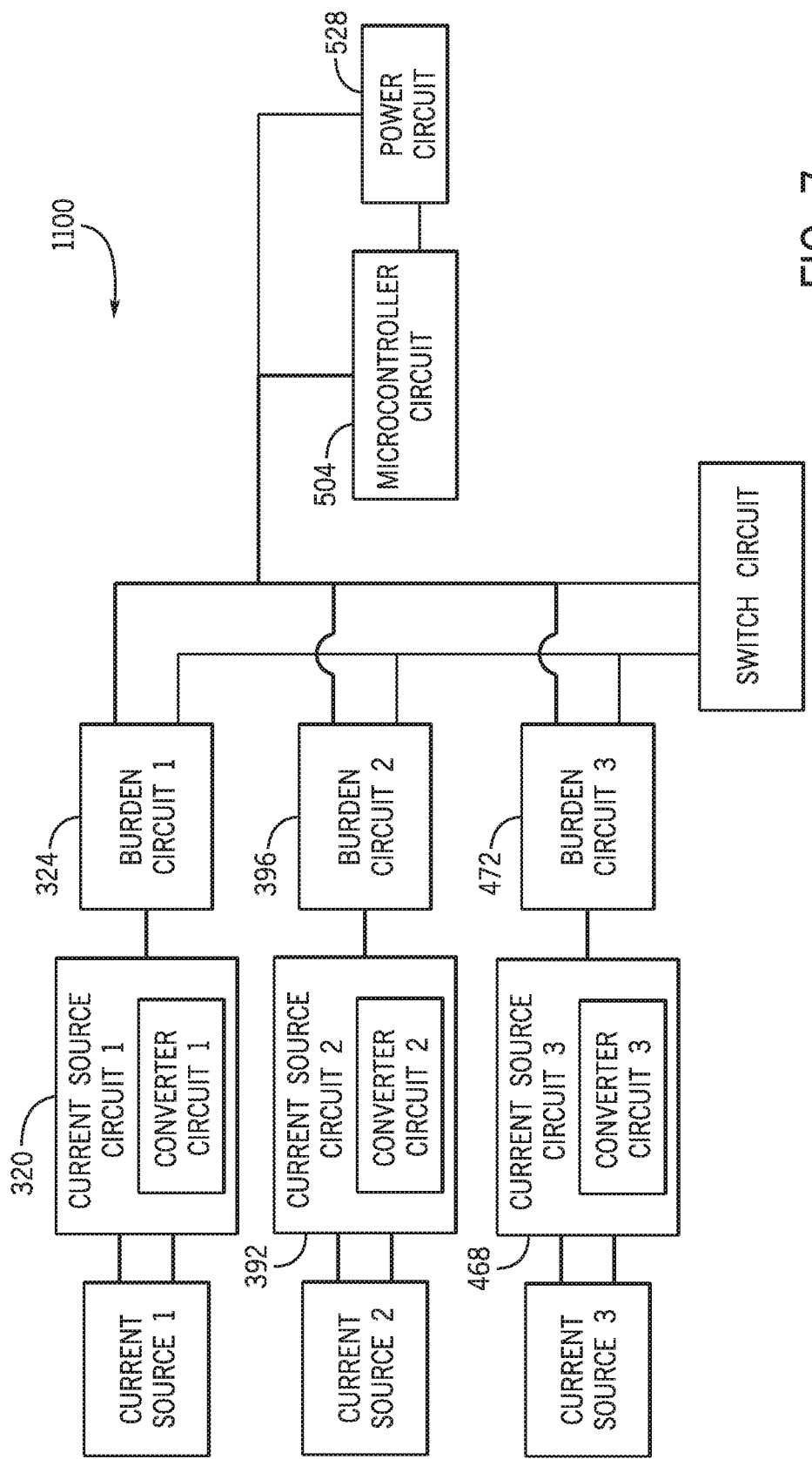
FIG. 7 is a circuit diagram showing current flow in a startup power supply configuration.

Referring now to FIG. 3 and to FIG. 7, a circuit diagram 1100 shows current flow in the startup power supply configuration. Current may flow through the current source circuits 320, 392, or 468 into the burden circuits 324, 396, or 472. Current may flow through the inherent winding resistances 312, 384, or 432. Current may flow through the diodes 340, 412, or 460. Current may flow from the burden circuits 324, 396, or 472 into the microcontroller circuit 504. The current flowing from the current source circuits 320, 392, or 468 may have a voltage. The voltage can have a value equal to at least a sum of: a voltage drop of one of the inherent winding resistances 312, 384, or 432; a voltage drop of one of the diodes 340, 412, or 460; and the minimum threshold voltage 580. The minimum threshold voltage 580 may be higher than the sum of one of the voltage drops of one of the inherent winding resistances 312, 384, or 432 added to one of the voltage drops of one of the diodes 340, 412, or 460.

Figure 8:
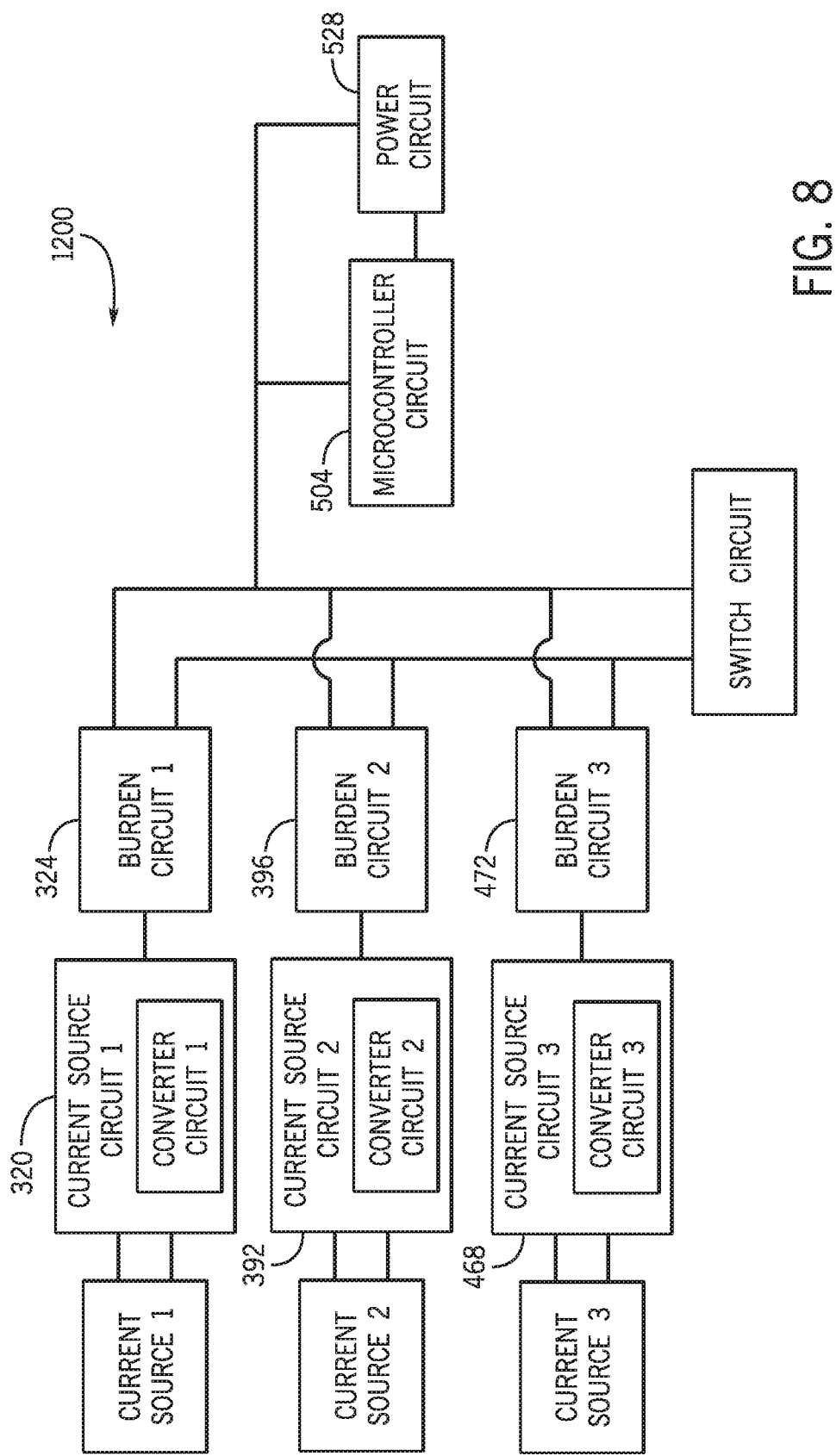
FIG. 8 is a circuit diagram showing current flow in a first sampling configuration.

Referring now to FIG. 3 and to FIG. 8, a circuit diagram 1200 shows current flow in the first sampling configuration. Current may flow through the current source circuits 320, 392, or 468 into the burden circuits 324, 396, or 472. Current may flow through the inherent winding resistances 312, 384, or 432. Current may flow through the burden resistors 328, 400, or 476. Current may flow from the burden circuits 324, 396, or 472 into the microcontroller circuit 504. Current may flow from the microcontroller circuit 504 into the capacitor circuit 528. The current flowing from the current source circuits 320, 392, or 468 may have a voltage 1204 (shown in FIG. 14). Voltage 1204 can have a value equal to at least a sum of: a voltage drop of one of the inherent winding resistances 312, 384, or 432; a voltage drop of one of the burden resistors 328, 400, or 476; and the minimum threshold voltage 580. The minimum threshold voltage 580 may be higher than the sum of one of the voltage drops of one of the inherent winding resistances 312, 384, or 432 added to one of the voltage drops of one of the burden resistors 328, 400, or 476. In addition, the voltage drops of one of the burden resistors 328, 400, or 476 may be higher than the voltage drops of one of the inherent winding resistances 312, 384, or 432, or the minimum voltage threshold 580. The values of the voltage drops of one of the burden resistors 328, 400, or 476 are variable. The values of the voltage drops depend on the current source as well as level of resistance of the burden resistors 328, 400, or 476 respectively.

Figure 9:
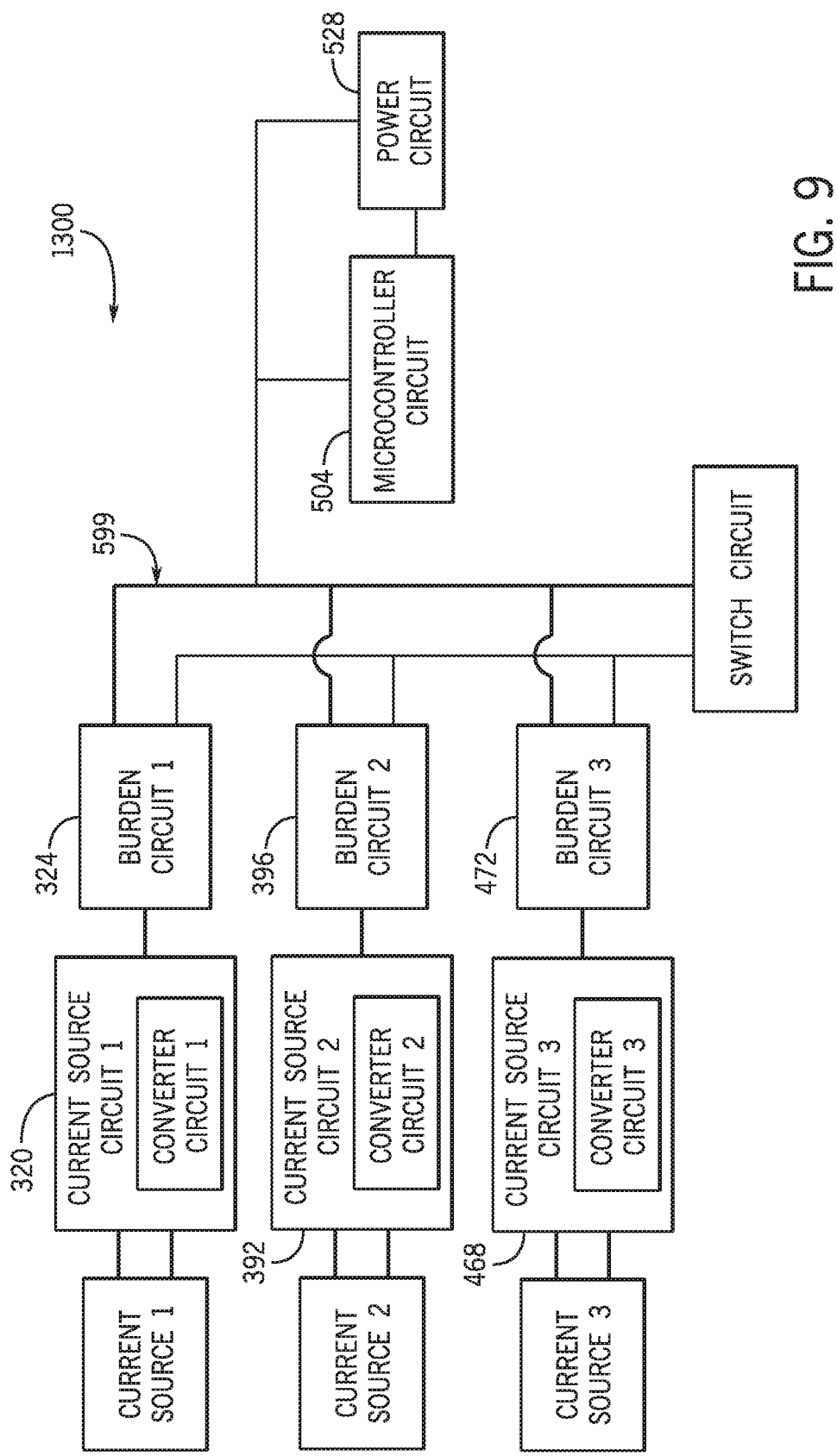
FIG. 9 is a circuit diagram showing current flow in a current transformer (CT) shorting configuration.

Referring now to FIG. 3 and to FIG. 9, a circuit diagram 1300 shows current flow in both the first CT shorting configuration and the second CT shorting configuration. Current may flow through the current source circuits 320, 392, or 468 into the burden circuits 324, 396, or 472. Current may flow through the inherent winding resistances 312, 384, or 432. Current may flow through the diodes 340, 412, or 460. The current flowing from the current source circuits 320, 392, or 468 may have a voltage 1304 (shown in FIG. 15). Voltage 1304 can have a value equal to at least a sum of: a voltage drop of one of the inherent winding resistances 312, 384, or 432; and a voltage drop of one of the diodes 340, 412, or 460. The minimum threshold voltage 580 may be higher than the sum of one of the voltage drops of one of the inherent winding resistances 312, 384, or 432 added to one of the voltage drops of one of the diodes 340, 412, or 460.

Figure 10:
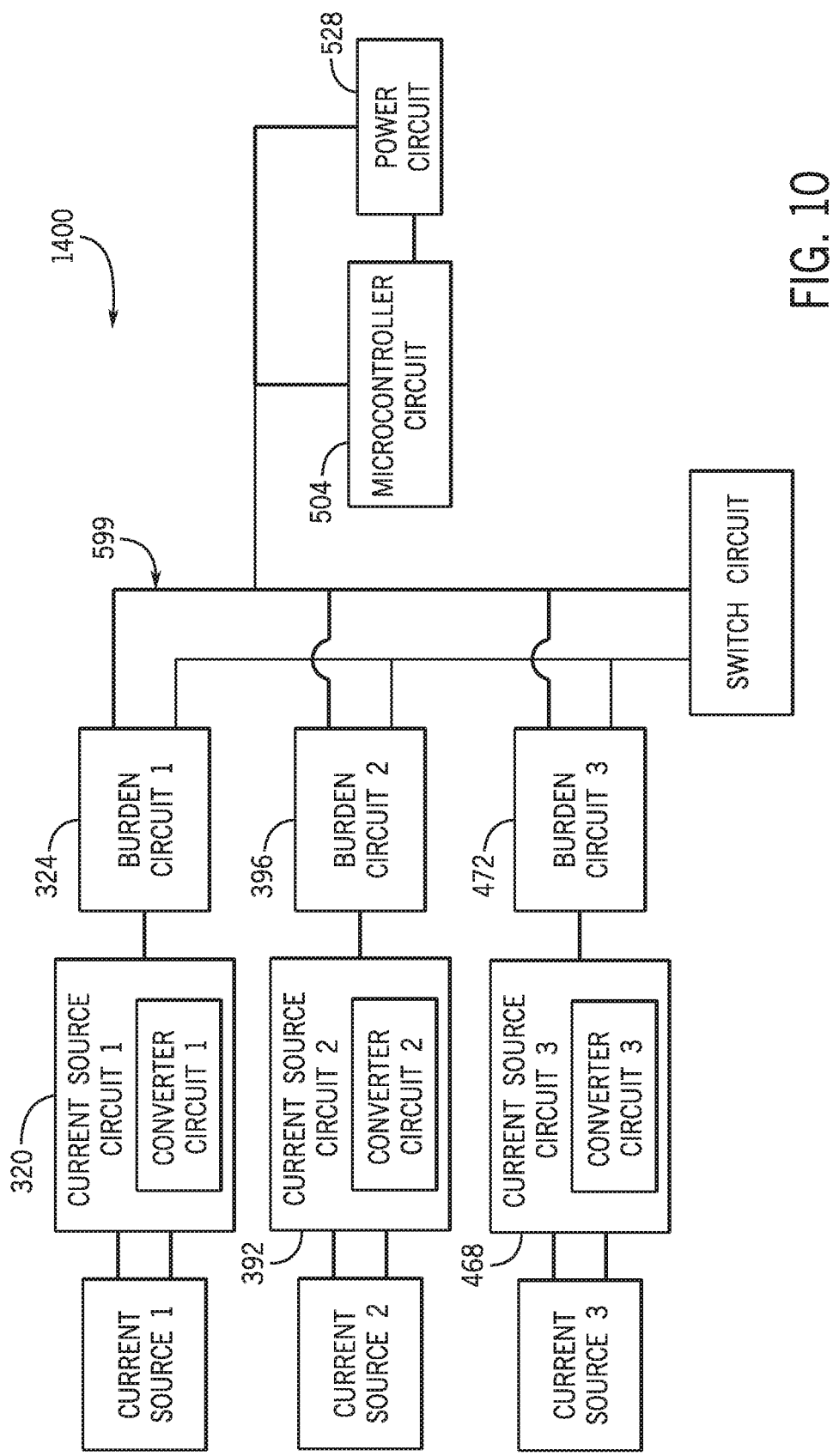
FIG. 10 is another circuit diagram showing current flow in a CT shorting configuration.

Referring now to FIG. 3 and to FIG. 10, a circuit diagram 1400 shows current flow in both the first CT shorting configuration and the second CT shorting configuration. Current may flow through the current source circuits 320, 392, or 468 into the burden circuits 324, 396, or 472. Current may flow through the inherent winding resistances 312, 384, or 432. Current may flow through the diodes 340, 412, or 460. Current may flow from the capacitor circuit 528 into the microcontroller circuit 504. The current flowing from the current source circuits 320, 392, or 468 may have a voltage 1404 (shown in FIG. 15). Voltage 1404 can have a value equal to at least a sum of: a voltage drop of one of the inherent winding resistances 312, 384, or 432; and a voltage drop of one of the diodes 340, 412, or 460. The minimum threshold voltage 580 may be higher than the sum of one of the voltage drops of one of the inherent winding resistances 312, 384, or 432 added to one of the voltage drops of one of the diodes 340, 412, or 460.

Figure 11:
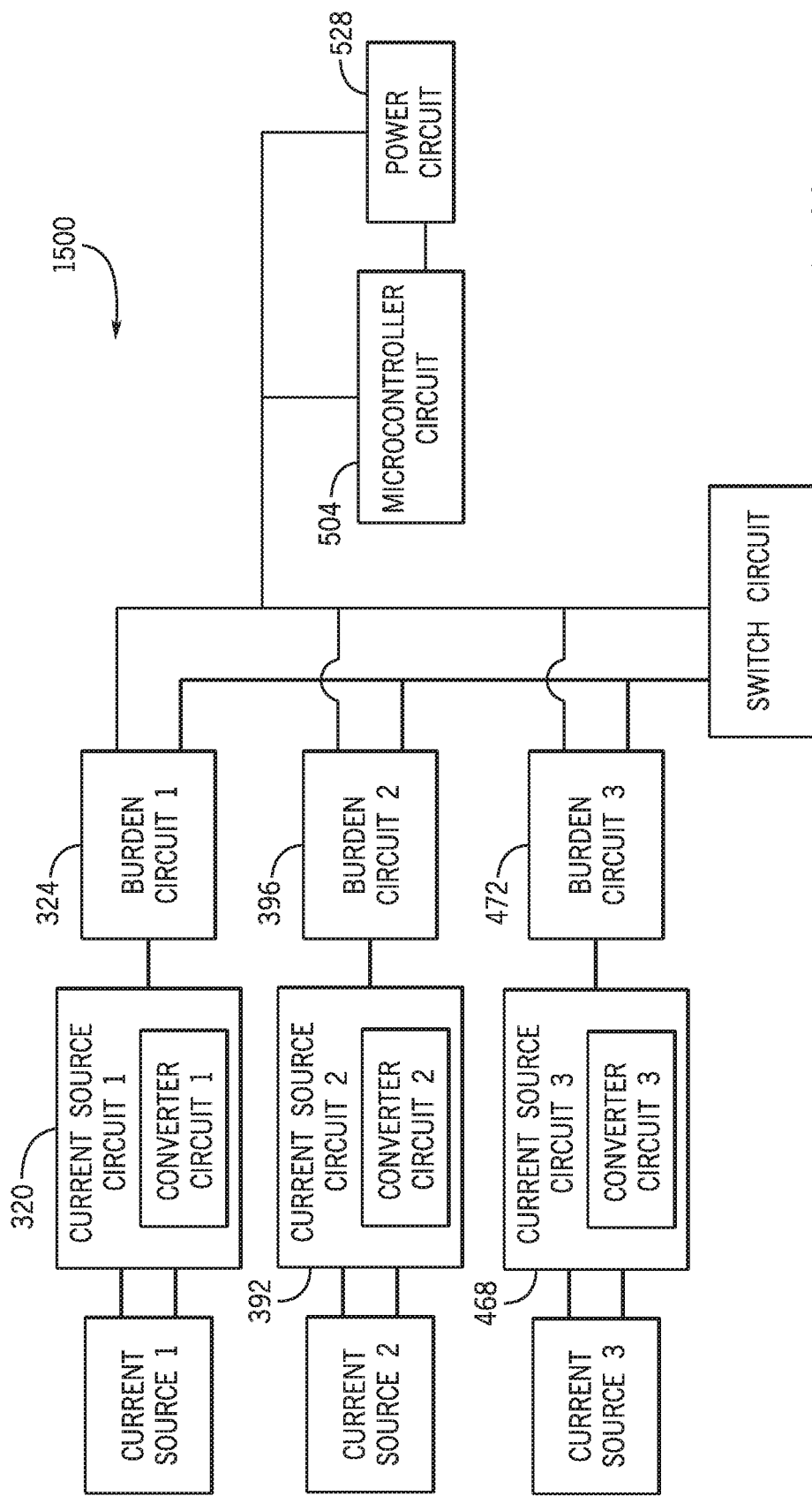
FIG. 11 is a circuit diagram showing current flow in a second sampling configuration.

Referring now to FIG. 3 and to FIG. 11, a circuit diagram 1500 shows current flow in the second sampling configuration. Current may flow through the current source circuits 320, 392, or 468 into the burden circuits 324, 396, or 472. Current may flow through the inherent winding resistances 312, 384, or 432. Current may flow through the burden resistors 328, 400, or 476. The current flowing from the current source circuits 320, 392, or 468 may have a voltage 1504 (shown in FIG. 15). Voltage 1504 can have a value equal to at least a sum of: a voltage drop of one of the inherent winding resistances 312, 384, or 432; a voltage drop of one of the burden resistors 328, 400, or 476; and the minimum threshold voltage 580. The minimum threshold voltage 580 may be higher than the sum of one of the voltage drops of one of the inherent winding resistances 312, 384, or 432 added to one of the voltage drops of one of the burden resistors 328, 400, or 476. In addition, the voltage drops of one of the burden resistors 328, 400, or 476 may be higher than the voltage drops of one of the inherent winding resistances 312, 384, or 432, or the minimum voltage threshold 580. The values of the voltage drops of one of the burden resistors 328, 400, or 476 are variable. The values of the voltage drops depend on the current source as well as level of resistance of the burden resistors 328, 400, or 476 respectively.

Figure 12:
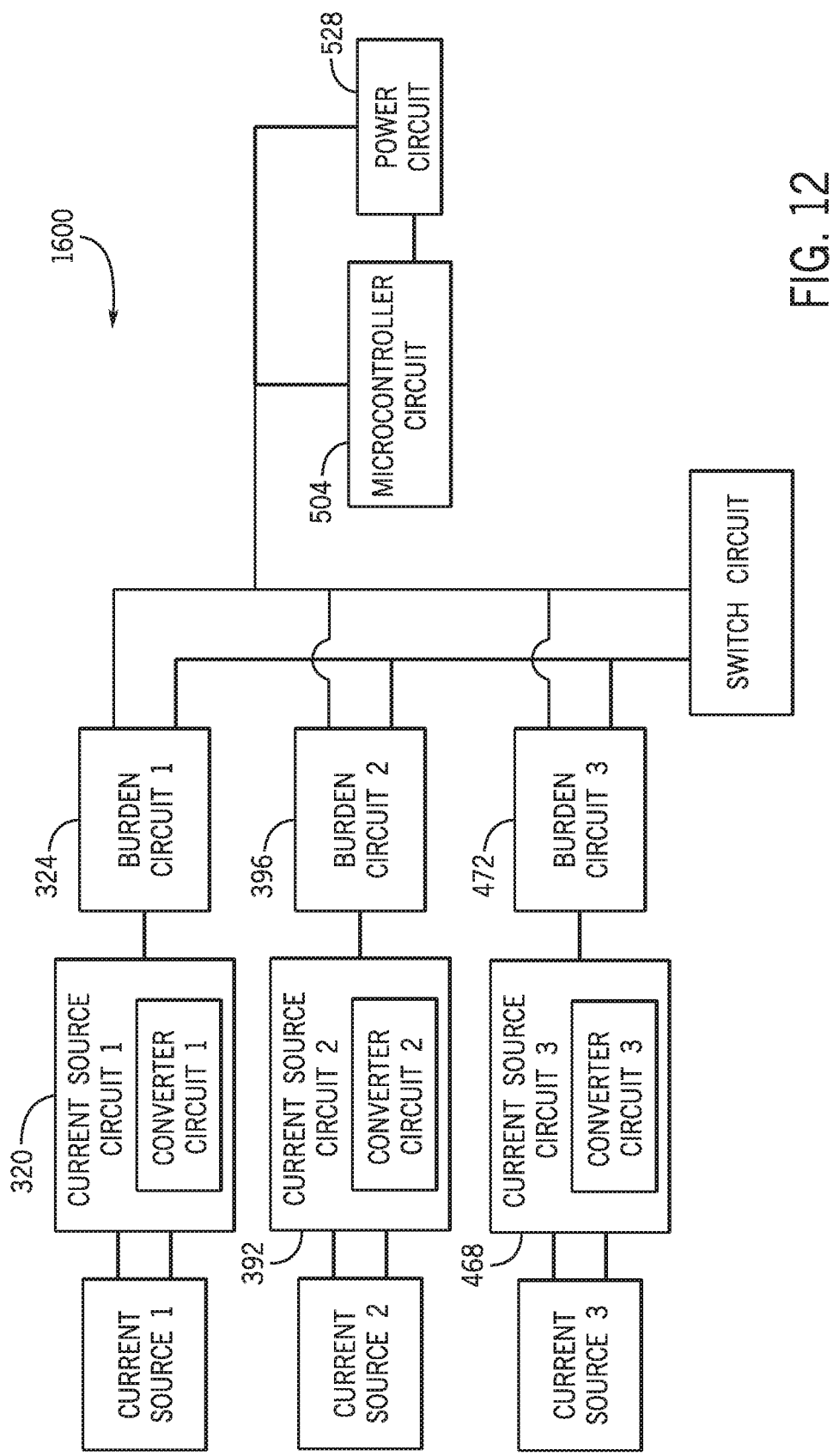
FIG. 12 is another circuit diagram showing current flow in a second sampling configuration.

Referring now to FIG. 3 and to FIG. 12, a circuit diagram 1600 shows current flow in the second sampling configuration. Current may flow through the current source circuits 320, 392, or 468 into the burden circuits 324, 396, or 472. Current may flow through the inherent winding resistances 312, 384, or 432. Current may flow through the burden resistors 328, 400, or 476. Current may flow from the burden circuits 324, 396, or 472 into the microcontroller circuit 528. Current may flow from the capacitor circuit 504 into the microcontroller circuit 528. The current flowing from the current source circuits 320, 392, or 468 may have a voltage 1604 (shown in FIG. 15). Voltage 1604 can have a value equal to at least a sum of: a voltage drop of one of the inherent winding resistances 312, 384, or 432; a voltage drop of one of the burden resistors 328, 400, or 476; and the minimum threshold voltage 580. The minimum threshold voltage 580 may be higher than the sum of one of the voltage drops of one of the inherent winding resistances 312, 384, or 432 added to one of the voltage drops of one of the burden resistors 328, 400, or 476. The minimum threshold voltage 580 may be higher than the sum of one of the voltage drops of one of the inherent winding resistances 312, 384, or 432 added to one of the voltage drops of one of the burden resistors 328, 400, or 476. In addition, the voltage drops of one of the burden resistors 328, 400, or 476 may be higher than the voltage drops of one of the inherent winding resistances 312, 384, or 432, or the minimum voltage threshold 580. The values of the voltage drops of one of the burden resistors 328, 400, or 476 are variable. The values of the voltage drops depend on the current source as well as level of resistance of the burden resistors 328, 400, or 476 respectively.

Turning now to FIG. 13, a graph 1700 of a voltage level of the holdup capacitor 524 over a period of time is shown. As one of ordinary skill in the art can see, the voltage level may be charged from a minimum threshold voltage 580 to a maximum threshold 584. The voltage level then gradually decreases from the maximum threshold 584 to the minimum threshold voltage 580 as the holdup capacitor 524 discharges. The ratio of time spent charging the holdup capacitor 524 to the time spent discharging the holdup capacitor 524 can influence how much time is spent in various operating modes a the current transformer circuit 300.

Figure 14:
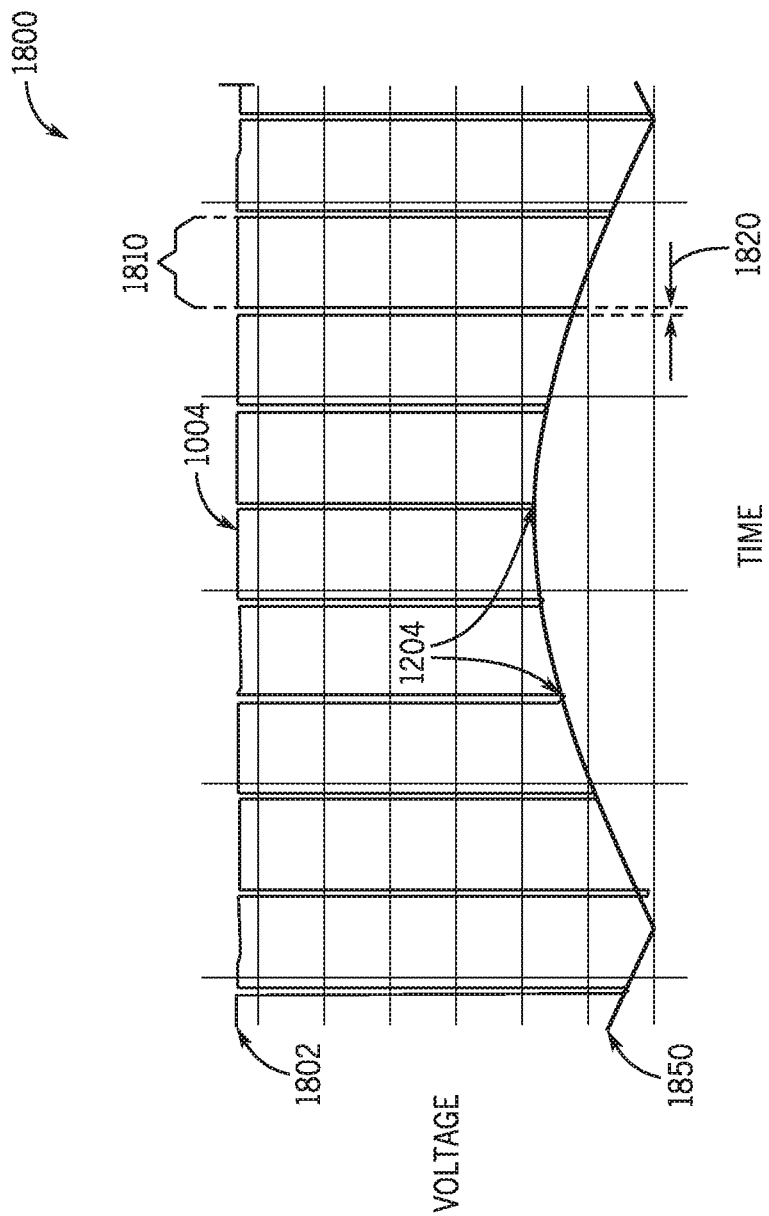
FIG. 14 is a graph of an exemplary operating voltage at a current source circuit with respect to time.

Referring now to FIGS. 3, 4, 6, 7 and 8 as well as FIG. 14, a graph 1800 of a circuit operating voltage 1802 at nodes 332, 404, or 480 with respect to time is shown.

Graph 1800 shows the circuit operating voltage 1802 when the current transformer circuit 300 is operating in the second mode 700. The circuit operating voltage 1802 can be a voltage of the current output wave 572. The circuit operating voltage 1802 can be directly related to how much power the current transformer circuit 300 consumes. During a power supply time period 1810, the circuit operating voltage 1802 can be voltage 1004, corresponding to the first power supply configuration and the second power supply configuration. During a first sampling time period 1820, the circuit operating voltage 1802 can be voltage 1204, corresponding to the first sampling configuration. As shown by the graph 1800, the voltage 1004 can be higher than the voltage 1204. Additionally, the power supply time period 1810 can be longer than the first sampling time period 1820. An ideal sampling voltage 1850 can represent what the circuit operating voltage 1802 would theoretically be at any given time if the current transformer circuit 300 is operating in the first sampling configuration.

Figure 15:
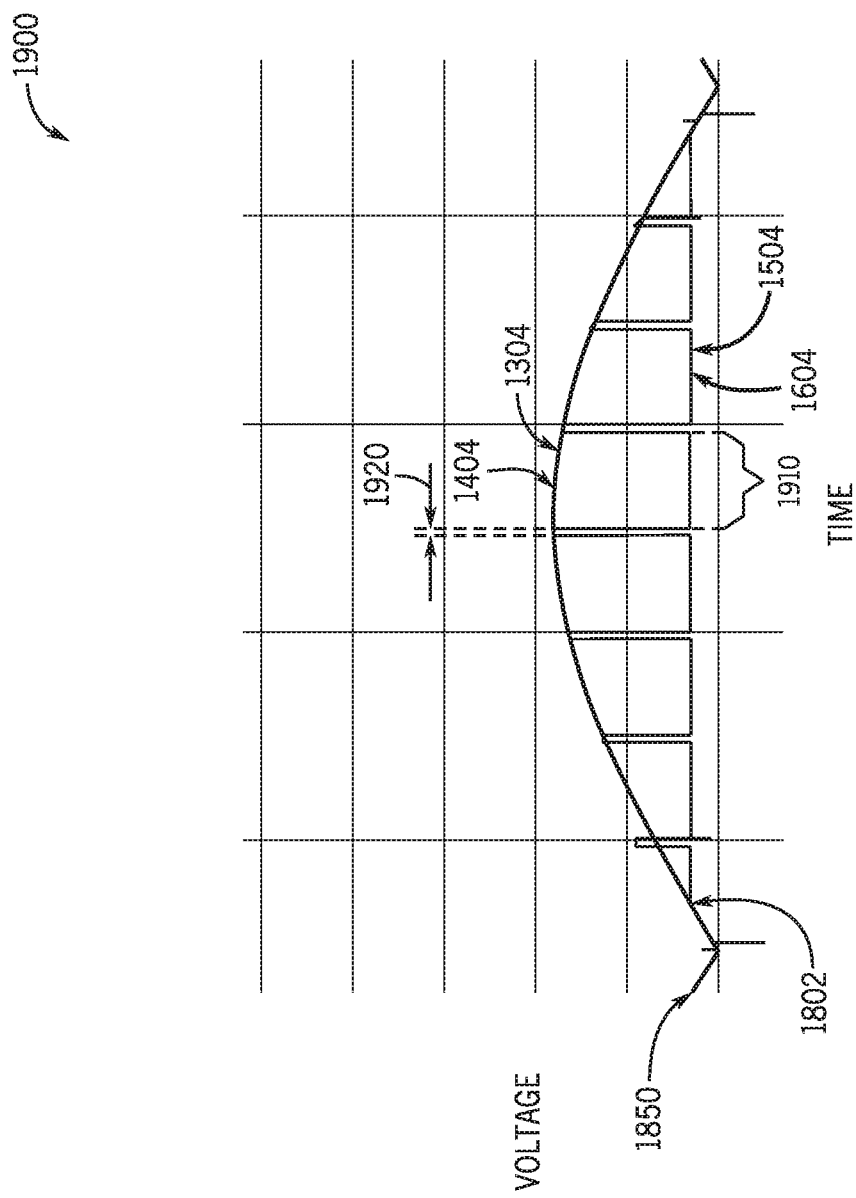
FIG. 15 is another graph of an exemplary operating voltage at a current source circuit with respect to time.

Referring now to FIGS. 3, 4 9, 10, 11, 12, and 14 as well as FIG. 15, another graph 1900 of the circuit operating voltage 1802 at the current source circuits 320, 392, or 468 with respect to time is shown. Graph 1900 shows the circuit operating voltage 1802 when the current transformer circuit 300 is operating in the fourth mode 900. During a CT shorting time period 1910, the circuit operating voltage 1802 can be voltage 1504 and voltage 1604, corresponding to the second sampling configuration. During a second sampling time period 1920, the circuit operating voltage 1802 can be voltage 1304 and voltage 1404, corresponding to the first CT shorting configuration and the second CT shorting configuration. As is shown in FIG. 15, the CT shorting time period 1910 may be longer than second sampling time period 1920. Additionally, as previously shown in FIG. 15, the time period spent discharging the holdup capacitor 524 can be longer than the time period spent charging the holdup capacitor 524. The time period spent discharging the capacitor can include the current transformer circuit 300 operating in the third mode 800 and/or the fourth mode 900. The third mode 800 can include utilizing the first CT shorting configuration, while the fourth mode 900 can include utilizing the second CT shorting configuration and/or the second sampling configuration. Therefore, a majority of the overall operational time of the current transformer circuit 300 can have the microcontroller 520 switched into the first CT shorting configuration, the second CT shorting configuration, or the second sampling configuration. Furthermore, the microcontroller can switch into the first CT shorting configuration or second CT shorting configuration for a longer portion of the operating time of the current transformer circuit 300 than the second sampling configuration. As one can see by comparing the graphs 1800 and 1900 of the circuit operating voltage 1802, the current transformer circuit 300 can spend the majority of its time operating at a low voltage and operate energy efficiently. The ideal sampling voltage 1850 can represent what the circuit operating voltage 1802 would theoretically be at any given time if the current transformer circuit 300 is operating in the second sampling configuration.

Figure 16:
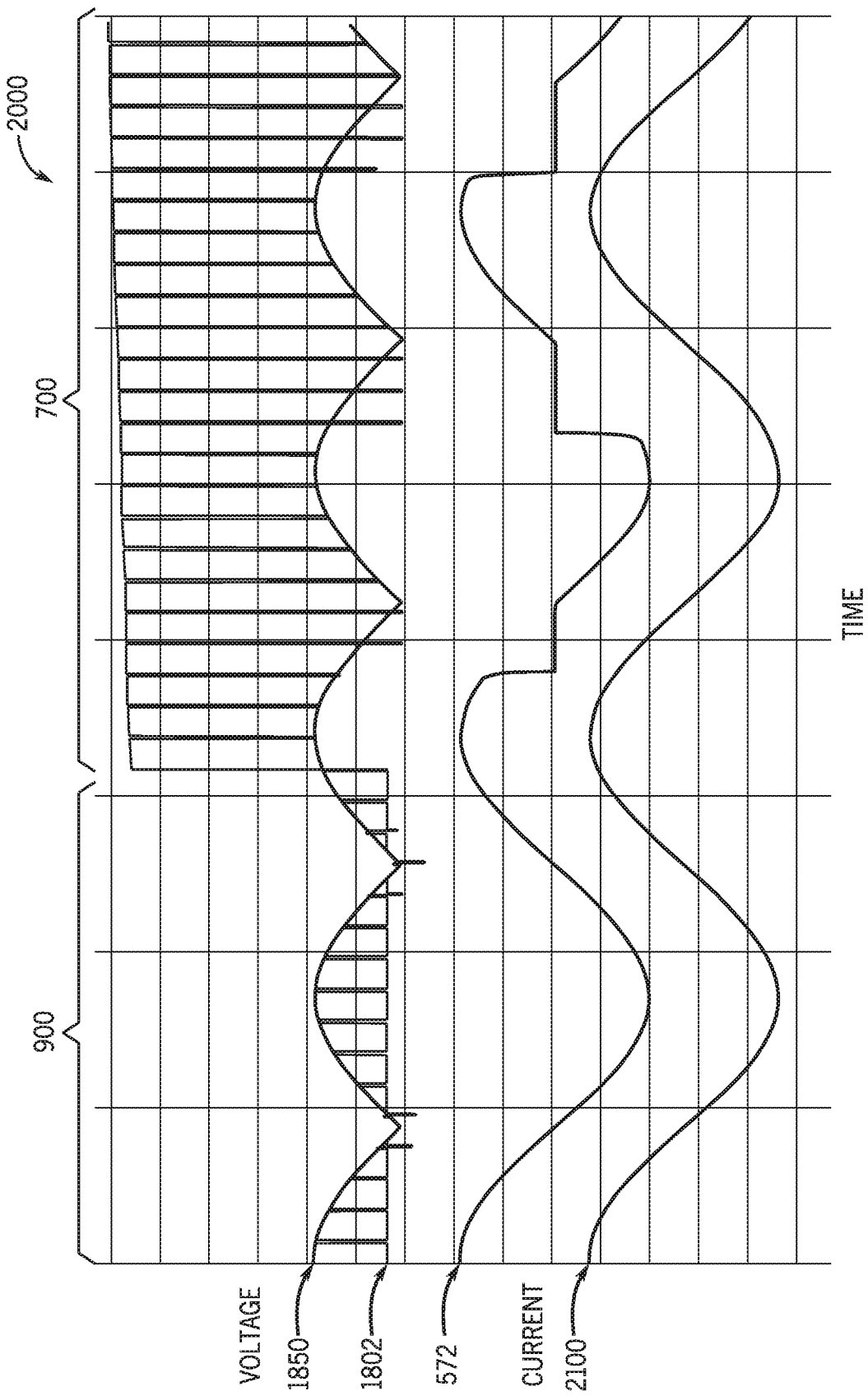
FIG. 16 is a graph of an exemplary operating voltage during various modes of operation.

Referring now to FIG. 16, a graph 2000 shows the circuit operating voltage 1802 during the second mode of operation 700, and the fourth mode of operation 900. The ideal sampling voltage 1850 can represent what the circuit operating voltage 1802 would be at any given time if the current transformer circuit 300 is operating in the first sampling configuration or the second sampling configuration.

A first time period, shows the circuit operating voltage 1802 during the fourth mode 900. A second time period shows the circuit operating voltage 1802 during the second mode 700. As one can see, the circuit operating voltage 1802 can be much lower on average in the fourth mode 900 than the second mode 700.

An ideal current output wave 2100 can be what the current emitted from the secondary windings 308, 380, 428 would theoretically be. The current output wave 572 can be what the current emitted from the secondary windings 308, 380, 428 actually is. As one can see, the current output wave 572 follows the ideal current output wave 2100 for the majority of the operational time while in the fourth mode 900. The current output wave 572 and ideal current output wave 2100 have been separated vertically for easier distinction, but it will be understood that both waves 572 and 2100 have the same current offset value.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Finally, it is expressly contemplated that any of the processes or steps described herein may be combined, eliminated, or reordered. Accordingly, this description is meant to be taken only by way of example, and not to otherwise limit the scope of this invention.

What is claimed is:

1. A current transformer circuit to dynamically switch a load, the current transformer circuit comprising:
   a current source circuit including at least one current transformer to produce a current output wave;
   a burden circuit including at least one burden resistor and a voltage sensor, at least a portion of the current output wave to be passed through the burden resistor, and the voltage sensor to sense a voltage across the at least one burden resistor, the burden circuit including at least one output configured to output the at least a portion of the current output wave;
   a switch circuit coupled to the burden circuit and including:
      a burden switch coupled to the at least one burden resistor at a first terminal included in the burden switch and to a ground at a second terminal included in the burden switch; and
      a CT short switch coupled to the at least one output at a first terminal included in the CT short switch and to the ground at a second terminal included in the CT short switch; and
   a microcontroller circuit including a microcontroller, the microcontroller circuit coupled to a power circuit and the switch circuit, the microcontroller configured to close the burden switch, short the at least one burden resistor to the ground, and sample the voltage across the at least one burden resistor in a sampling configuration, the microcontroller further configured to close the CT short switch and switch at least one secondary winding of the at least one current transformer to a low resistance load in a shorting configuration.

2. The current transformer circuit according to claim 1, wherein the microcontroller is configured to control the switch circuit based on an input voltage of the power circuit to dynamically switch the secondary winding of the at least one current transformer between the burden resistor, the power circuit, and the low resistance load.

3. The current transformer circuit according to claim 1, wherein the microcontroller circuit comprises a voltage regulation device and at least one holdup capacitor, the holdup capacitor to supply current to the microcontroller when the secondary winding of the at least one current transformer is either the burden resistor or the low resistance load.

4. The current transformer circuit according to claim 1, wherein the power circuit comprises:
at least one of at least one capacitor and a relay capacitor switch, and
an auxiliary power supply configured to supply a predetermined power to the microcontroller.

5. The current transformer circuit according to claim 1, wherein the microcontroller is configured to control the switch circuit to dynamically switch the secondary winding of the at least one current transformer between one of a second operating mode and a fourth operating mode.

6. The current transformer circuit according to claim 5, wherein the second operating mode includes a second power supply configuration and a first sampling configuration, and in the second power supply configuration, the CT short switch is open, and the burden switch is open, and in the first sampling configuration, the CT short switch is open, and the burden switch is closed.

7. The current transformer circuit according to claim 6, wherein the microcontroller is configured to hold the first sampling configuration for less than a half cycle of the current output wave.

8. The current transformer circuit according to claim 5, wherein the fourth operating mode includes a second CT shorting configuration and a second sampling configuration, and in the second CT shorting configuration, the CT short switch is closed, and the burden switch is open, and in the second sampling configuration, the CT short switch is open and the burden switch is closed.

9. The current transformer circuit according to claim 5, wherein the microcontroller is configured to control the switch circuit to dynamically switch the secondary loading of the at least one current transformer between one of a first operating mode, the second operating mode, a third operating mode, and the fourth operating mode.

10. The current transformer circuit according to claim 9, wherein the power circuit includes a relay capacitor switch, and wherein the first operating mode includes a first power supply configuration and a startup power supply configuration, and in the first power supply configuration, the relay capacitor switch is closed, the CT short switch is open, and the burden switch is open, and in the startup power supply configuration, the relay capacitor switch is open, the CT short switch is open, and the burden switch is open.

11. The current transformer circuit according to claim 9, wherein the third operating mode includes a first CT shorting configuration, and in the first CT shorting configuration, the CT short switch is closed, and the burden switch is open.

12. The current transformer circuit according to claim 1, further comprising a converter circuit configured to convert the current output wave to a unipolar current output signal, and wherein the current output wave is an AC current output wave.

13. The current transformer circuit according to claim 1, wherein the voltage sensor comprises an analog to digital converter.

14. A current transformer circuit to dynamically switch a load, the current transformer circuit comprising:
a current source circuit including at least one current transformer configured to produce a current output wave;
a burden circuit including at least one burden resistor and a voltage sensor, the voltage sensor configured to sense a voltage across the at least one burden resistor, the burden circuit including at least one output corresponding to the at least a portion of the current output wave;
a switch circuit including a burden switch and a CT short switch, the burden switch coupled to the at least one burden resistor at a first terminal included in the burden switch and to a ground at a second terminal included in the burden switch, and the CT short switch coupled to the at least one output at a first terminal included in the CT short switch and to the ground at a second terminal included in the CT short switch; and
a microcontroller circuit including a microcontroller, the microcontroller circuit coupled to a power circuit and the switch circuit, the microcontroller configured to close the burden switch, short the at least one burden resistor to the ground, and sample the voltage across the at least one burden resistor in a sampling configuration, the microcontroller further configured to close the CT short switch and switch at least one secondary winding of the at least one current transformer to a low resistance load in a shorting configuration.

15. The current transformer circuit according to claim 14, wherein the current transformer circuit is coupled to one of an overload relay or a circuit breaker.

16. A method for dynamically switching a load of a current transformer circuit, the method comprising:
outputting a current output wave via at least one output of a burden circuit including at least one burden resistor;
coupling a burden switch to the at least one burden resistor at a first terminal included in the burden switch and to a ground at a second terminal included in the burden switch;
coupling a CT short switch to the at least one output at a first terminal included in the CT short switch and to the ground at a second terminal included in the CT short switch;
closing the burden switch to short the burden resistor to the ground in a sampling configuration;
sampling a voltage across the burden resistor in the sampling configuration; and closing the CT short switch to switch at least one secondary winding of a current transformer included in the current transformer circuit to a low resistance load in a shorting configuration.

17. The method according to claim 16, further comprising:
basing the dynamic switching on power needs of an electronic device,
wherein the current transformer circuit is part of the electronic device.

18. The method according to claim 16, further including configuring the load of the current transformer circuit in one of a first operating mode, a second operating mode, a third operating mode, and a fourth operating mode.

19. The method according to claim 18, wherein configuring the load of the current transformer circuit includes activating at least one of the burden switch, and the CT short switch.

* * * * *